United States Patent [19]
Kess

[11] Patent Number: 4,902,975
[45] Date of Patent: Feb. 20, 1990

[54] NMR TOMOGRAPHY APPARATUS HAVING IRON-FREE DC MOTORS FOR CAPACITOR ADJUSTMENT

[75] Inventor: Helmut Kess, Deggendorf, Fed. Rep. of Germany

[73] Assignee: Siemens Aktiengesellschaft, Berlin and Munich, Fed. Rep. of Germany

[21] Appl. No.: 641,726

[22] Filed: Aug. 17, 1984

[30] Foreign Application Priority Data

Oct. 5, 1983 [DE] Fed. Rep. of Germany ....... 3336254

[51] Int. Cl.$^4$ ............................................. G01R 33/20
[52] U.S. Cl. .................................................. 324/318
[58] Field of Search ............... 324/307, 318, 319, 320; 310/36, 308; 361/289, 290

[56] References Cited

U.S. PATENT DOCUMENTS

| | | | |
|---|---|---|---|
| 2,413,391 | 12/1946 | Usselman | 310/308 |
| 4,035,697 | 7/1977 | Arnold, Jr. | 361/289 |
| 4,052,661 | 10/1977 | Higham et al. | 324/322 |
| 4,129,822 | 12/1978 | Traficante | 324/322 |

FOREIGN PATENT DOCUMENTS 2225899 12/1973 Fed. Rep. of Germany ...... 324/322
3124435 1/1983 Fed. Rep. of Germany .

Primary Examiner—Michael J. Tokar
Assistant Examiner—Kevin O'Shea
Attorney, Agent, or Firm—Hill, Van Santen, Steadman & Simpson

[57] ABSTRACT

A nuclear magnetic resonance tomography apparatus has a coil for generating a basic magnetic field, a gradient coil and measuring coils. A capacitor arrangement precisely adjusts the resonance of the measurement coil to the basic field coil. An iron-free dc motor is disposed within the field generated by the basic field coil for physically adjusting the plates of the capacitors connected in the circuit including the measurement coil. The rotor and coils of the iron-free dc motor are disposed within the basic magnetic field such that the basic magnetic field functions as the stator field for operating the motor.

2 Claims, 2 Drawing Sheets

NMR TOMOGRAPHY APPARATUS HAVING IRON-FREE DC MOTORS FOR CAPACITOR ADJUSTMENT

BACKGROUND OF THE INVENTION

1. Field of the Invention

The present invention relates to devices for forming images of an examination subject utilizing nuclear magnetic resonance tomography, and in particular such an apparatus having adjustable capacitors wherein the motors for moving the capacitor plates are operated by the basic magnetic field of the apparatus.

2. Description of the Prior Art

Tomography devices are known which operate based on the concept of nuclear magnetic resonance, having means for applying a basic magnetic field as well as a gradient field to the examination subject, and for detecting deflection of the atomic nuclei of the examination subject from their normal state of equilibrium by the presence of a high frequency magnetic stimulation pulse. Such a device is described, for example, in German OS 31 24 435, corresponding to U.S. application Ser. No. 379,998 (Loeffler et al) now abandoned assigned to the assignee of the present subject matter.

Such devices operate by deflecting atomic nuclei, such as the hydrogen nuclei, of an examination subject from a preferred orientation, the preferred orientation being generated by a basic magnetic field, and the deflection occurring as the result of a high frequency stimulation pulse. After the end of the stimulation pulse, the atomic nuclei, due to their spin, return to the preferred orientation after a certain delay. During the delay, the atomic nuclei precess with a frequency which is dependent upon the intensity of the basic magnetic field. If a field gradient is superimposed on this uniform basic magnetic field, so that the magnetic field distribution varies spatially, identification of selected positions within the examination subject is accomplished by measuring the frequency. By selectively altering the direction of the field gradient, layered or tomographic images of the examination subject can be obtained. Stimulation of a selected layer of the examination subject is achieved by applying the field gradient with respect to the basic magnetic field such that excitation of atomic nuclei in the examination subject occurs only in the layer of interest. This is possible because such excitation occurs only with a frequency which is precisely associated with the magnetic field in the desired layer.

A problem in the construction and operation of such NMR tomographic devices is the necessity of precisely adjusting the resonance of the measurement and stimulation coil. For this purpose, the particular coil can be connected with a capacitor arrangement, the capacitor arrangement being tuned corresponding to the desired frequency. Variable capacitors may be employed for this purpose. The coil to be tuned in this manner is disposed in the interior of the basic magnetic field. For adjusting the plates of variable capacitors, electromotors must also be disposed in the interior of the basic magnetic field. Conventional motors with iron cores are not suited for this purpose because such motors are not operative in the relatively strong magnetic field generated by the basic field coil.

SUMMARY OF THE INVENTION

It is an object of the present invention to provide an NMR tomography apparatus having a plurality of variable capacitors for tuning the measurement coils which has a means for physically adjusting the capacitor plates which is uninfluenced by the basic magnetic field of the device.

The above object is inventively achieved in an NMR tomographic apparatus having a plurality of iron-free dc motors respectively associated with each adjustable capacitor, the motors being disposed within the basic magnetic field of the basic field coil such that the basic magnetic field functions as the stator field for the motors, and causes rotation of the respective motor rotors.

DESCRIPTION OF THE PREFERRED EMBODIMENTS

Figure 1:
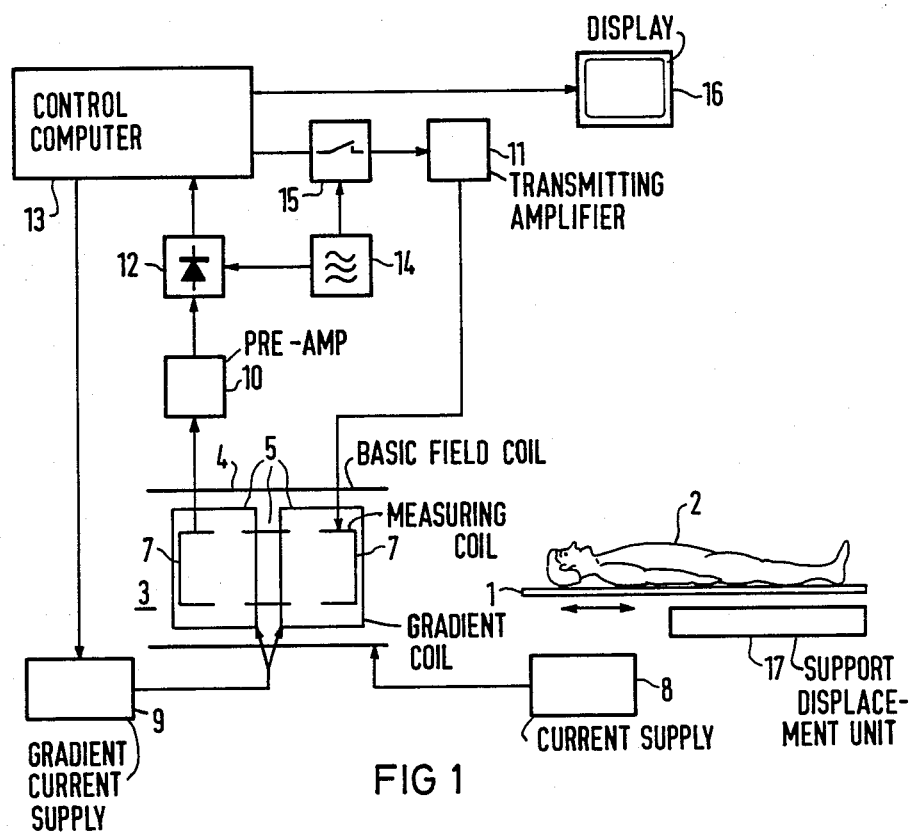
FIG. 1 is a schematic circuit diagram of a nuclear magnetic resonance tomography apparatus in which the principles of the present invention are utilized.

A nuclear magnetic resonance tomography apparatus is shown in FIG. 1 having a support 1 for a patient 2, tomographic images of the patient formed by nuclear magnetic resonance. For this purpose, a coil system 3 is provided having a basic field coil 4 for generating a uniform basic magnetic field, gradient coils 5 for varying the basic magnetic field, and a stimulation and measuring coil 7. The basic field coil 4 is connected to a current supply 8, the gradient coils 5 are connected to a gradient current supply 9, and the stimulation and measuring coil 7 is connected to a preamplifier 10 and, through suitable coupling elements, to a transmitting amplifier 11. The preamplifier 10 supplies a measuring signal, through a phase-selective rectifier 12 to a process control computer which controls the entire measuring operation. A high frequency oscillator 14 generates a stimulation pulse, and is connectable to the transmitting amplifier 11 through a modulator 15. The images formed thereby are displayed on a monitor 16.

In order to form an image of a section of the patient 2 by means of nuclear magnetic resonance, the support 1 with the patient 2 thereon is moved by means of a support displacement unit 17, activated by the process control computer 13, into the coil system 3 such that a desired layer of the patient 2 is disposed for stimulation of nuclear resonance therethrough by a stimulation pulse in the coil 7. A measuring signal, picked-up by the coil 7, is used to generate data with different field gradients, the data rendering possible reproduction of the image of the examined layer of the patient 2 on the monitor 16.

Figure 2:
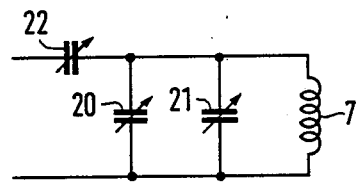
FIG. 2 is a circuit diagram for tuning the inductance of a stimulation and a measuring coil.

A circuit diagram is shown in FIG. 2 showing how the resonance of the coil 7 can be precisely tuned. For this purpose two variable capacitors 20 and 21 are connected in parallel with the coil 7 and a variable capacitor 22 is connected in series with this parallel arrangement.

Figure 3:
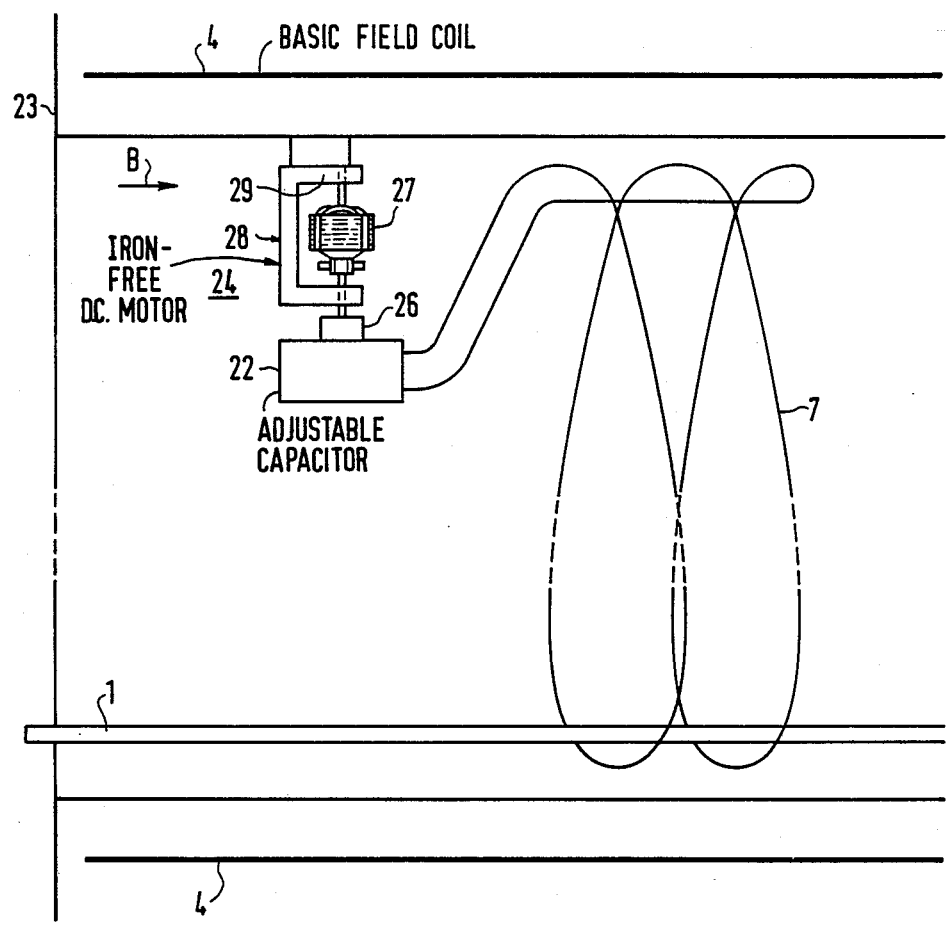
FIG. 3 is a side view of a means for adjusting an adjustable capacitor in the NMR tomography apparatus shown in FIG. 1 constructed in accordance with the principles of the present invention.

The interior of the apparatus shown in FIG. 1 is shown in detail and in enlarged side view in FIG. 3. The basic field coil 4 is disposed in a housing 23 which defines a tubular hollow volume 24 into which the patient 2 on the support 1 is moved. The stimulation and measuring coil 7 thus surrounds the patient 2, as do the additional coils shown in FIG. 1. The coil 7 is electrically connected to the adjustable capacitor 22. The plates of the capacitor 22 are movable by an iron-free dc motor 28 having a rotor 27 connected to the capacitor plates by suitable gearing 26. The rotor 27 is rotatably mounted in a stirrup 29 which is attached to the housing 23 so as to permit the basic field generated by the coil 4, operating in the direction indicated by arrow B, to act upon the coils of the rotor 27 as the stator field, and thereby operate the motor 28.

Capacitors 20 and 21, although not shown in FIG. 3 are also electrically connected to the coil 7 and are adjusted by means of additional motors corresponding to the motor 28 in an identical manner.

Although modifications and changes may be suggested by those skilled in the art it is the intention of the inventor to embody within the patent warranted hereon all changes and modifications as reasonably and properly come within the scope of his contribution to the art.

What is claimed is:

1. In a nuclear magnetic resonance tomography apparatus having a means for generating a basic magnetic field, a means for superimposing a gradient on said basic magnetic field, a stimulation and measuring means for inducing nuclear resonance in a selected layer of an examination subject and for measuring the frequency thereof, and a means for initially tuning said stimulation and measuring means by physically displacing at least a portion of a circuit element connected to said stimulation and measuring means, the improvement comprising:

said means for initially tuning including an iron-free dc motor having a rotor connected to said displaceable portion of said circuit element, said rotor being disposed in said basic magnetic field such that said basic magnetic field functions as a stator field for rotating said rotor.

2. The improvement of claim 1 wherein said stimulation and measuring means is a coil surrounding said examination subject, and wherein said circuit element is a capacitor and said displaceable portion is at least one plate of said capacitor.

* * * * *